(12) United States Patent
Lesso

(10) Patent No.: US 8,854,132 B2
(45) Date of Patent: Oct. 7, 2014

(54) AMPLIFIER CIRCUIT

(71) Applicant: John Paul Lesso, Edinburgh (GB)

(72) Inventor: John Paul Lesso, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 61 days.

(21) Appl. No.: 13/673,760

(22) Filed: Nov. 9, 2012

(65) Prior Publication Data

US 2013/0120063 A1    May 16, 2013

Related U.S. Application Data

(60) Provisional application No. 61/558,845, filed on Nov. 11, 2011.

(51) Int. Cl.
   *H03F 3/217*    (2006.01)

(52) U.S. Cl.
   USPC .......................................................... 330/251

(58) Field of Classification Search
   CPC ..... H03F 3/217; H03F 3/2173; H03F 3/2171; H03F 2200/351; H03F 2200/03; H03F 2200/331; H03F 2200/78; H03F 3/3081; H03F 1/3217; H03F 1/0233; H03F 3/02; H03F 1/26; H03F 3/2178; H03F 2200/432; H03F 2200/33; H03F 2217/0045
   USPC ................................ 330/10, 146, 207 A, 251
   See application file for complete search history.

(56) References Cited

U.S. PATENT DOCUMENTS

| | | | |
|---|---|---|---|
| 6,472,933 B2 | 10/2002 | Hsu | |
| 6,867,722 B2 | 3/2005 | Hochschild | |
| 7,675,361 B2 * | 3/2010 | Guo et al. | 330/251 |
| 7,705,673 B2 * | 4/2010 | Teng et al. | 330/251 |
| 7,772,924 B2 * | 8/2010 | Matamura | 330/251 |
| 7,965,137 B2 * | 6/2011 | Takagi | 330/251 |
| 7,969,242 B2 | 6/2011 | Garudadri et al. | |
| 2003/0038674 A1 * | 2/2003 | Masuda et al. | 330/10 |
| 2012/0013402 A1 * | 1/2012 | Song et al. | 330/207 A |

* cited by examiner

*Primary Examiner* — Khanh V Nguyen
(74) *Attorney, Agent, or Firm* — Dickstein Shapiro LLP

(57) ABSTRACT

Class D amplifier circuits for amplifying an input signal. The amplifier has an H-bridge output stage and thus has switches for switchably connecting a first output to a first voltage, e.g. Vdd, or a second voltage (e.g. ground) and for switchably connecting a second output to the first or second voltages. A switch controller is configured to control the H-bridge stage so as to vary between a plurality of states including at least a first state in which the outputs are both connected to the first voltage and a second state in which the outputs are both connected to said second voltage. The switch controller is configured to vary the proportion of time spent in the first state relative to the second state based on an indication of the amplitude of the input signal. The amplifier may therefore have first circuitry for deriving a proportion value (α) based on the input signal (Din) and second circuitry for generating control signals for selecting the first state or said second state based on the proportion value (α).

38 Claims, 7 Drawing Sheets

AMPLIFIER CIRCUIT

This application claims the benefit of U.S. Provisional Application No. 61/558,845, filed on Nov. 11, 2011, the disclosure of which is incorporated by reference in its entirety.

BACKGROUND OF THE INVENTION

1. Field of the Invention

This invention relates to Class-D amplifier circuits, especially to Pulse-Density-Modulated or Sigma-Delta Class-D amplifiers with an H-bridge output.

2. Description of the Related Art

FIG. 1 shows a basic arrangement of a pulse-density-modulated (PDM) Class-D amplifier, sometimes referred to as a Sigma-Delta amplifier. An output stage 101 comprises four switches connected in an H-bridge arrangement between two supplies, typically a supply voltage Vdd and ground. Feedback signals from the output terminals 102 and 103 of the H-bridge are respectively subtracted from input signals Vin+ and Vin− of the amplifier in order to generate respective error signals which are passed through a loop filter 104, for example an integrator.

The output signal from the loop filter 104 is quantised by a comparator 105 that is clocked to provide a digital control signal at a desired drive frequency $F_{DD}$. The desired drive frequency $F_{DD}$ is significantly higher than the frequency of the input signals, Vin+ and Vin−, to be amplified and, for an audio amplifier, the desired drive frequency $F_{DD}$ may have a frequency of the order of MHz, for example 3 MHz.

The digital control signal may be passed through optional logic 106 before being received by the pre-driver logic 107 to generate buffered gate drive signals for controlling the switches in the H-bridge output stage 101.

In a basic Class-D amplifier such as illustrated in FIG. 1, the H-bridge output may be operable in two states only, those illustrated as states A and B in FIG. 2: it should be noted that in use a load (not illustrated) is connected between the output terminals 102 and 103 of the H-bridge 101. In continuous state A, assuming the upper rail is at Vdd and the lower rail is at ground, the output voltage across the load, i.e. terminals 102, 103, will settle to +Vdd (ignoring any switch voltage drops). In continuous state B, the voltage across the load will settle to −Vdd. Switching between states A and B with an effective duty of cycle of 50:50 will result in an output that settles to zero and other duty cycles will result in intermediate differential d.c. output voltages. Thus the switch drive signals control the H-bridge output to switch between states A and B as required and the output is averaged by an inductance (possibly an inductance associated with the load) to give low (e.g. audio) frequency components which follow the input signal.

One issue with such a two-state Class-D amplifier is that for low signals the H-bridge output stage 101 will switch between the states A and B at a rapid rate to maintain a low output voltage. Each transition between states will consume power, for example in charging and discharging the relatively large output MOS switch transistors. Also, even for minimal input signals the load will alternate between having +Vdd and −Vdd applied across it, with a consequent alternating ramp of current $dI/dt=\pm Vdd/L$, where L is the load inductance. This will lead to substantial ripple current in the load, especially for low load inductance, which will tend to cause power losses. The large differential-mode voltage ripple across the load may also result in consequent EMI problems, especially if the load is somewhat distant from the driver amplifier, i.e. H-bridge output stage 101.

To mitigate these effects the H-bridge output stage 101 may also be operated in a third state, state C as illustrated in FIG. 2. In this state C both output terminals 102, 103 are connected to ground. The comparator 105 of FIG. 1 may therefore be modified to generate three output logic states, which may be regarded as +1, 0, −1 say, by comparing the integrated error signal at the loop filter output against two separate thresholds, for example +Vdd/3 and −Vdd/3. The logic states +1, 0, −1 drive the H-bridge 101 in states A, C, B respectively.

At small signal levels the H-bridge 101 output will usually be in state C, with just the occasional pulse of states A or B to correct the low frequency components of the output voltage. Thus there will be far fewer transitions for low signals with a consequent saving in power. Also since there are fewer transitions, for a given inductance connected to the output the average ripple current will be lower resulting in reduced differential mode EMI. This means that if a certain amount of ripple current is acceptable (for a given signal level), this level of ripple current can achieved using a smaller series inductor than would be the case with just a two state amplifier or indeed just relying on the parasitic inductance of a speaker load.

In such an arrangement however the common-mode output voltage will vary. In both state A and state B the common-mode output voltage is equal to Vdd/2. In state C the common-mode output voltage is zero. Thus, at high signal levels, when the H-bridge 101 will be predominantly in state A or state B the average common-mode output voltage will be at or near Vdd/2. However at low signals the H-bridge 101 will be predominantly in state C and the average common-mode output voltage will be near zero.

Thus if a low-frequency sinusoidal signal of amplitude Vdd is generated at the output of the H-bridge 101, the common-mode voltage will be modulated between zero and Vdd/2. In other words the common-mode voltage will correspond to a full-wave rectified version of the audio input signal Vin, i.e. Vin+, Vin−. Whilst ideally this would not matter, in practice the subtraction of the feedback signal from the input signal at the input to the loop filter 104 will be performed by resistor networks that may suffer from random manufacturing mismatches. Thus the common-mode rejection ratio of the subtractor may be in the region of 40 dB to 60 dB. Modulation of the common-mode voltage in this way can therefore cause spurious differential-mode signal components at the summing point, which the loop filter 104 will cancel by generating a corresponding real differential signal at the output. As the spurious signal contains harmonics of the output sine wave the actual output will also contain opposite harmonic components to cancel this spurious signal and thus harmonic distortion will appear across the load. Also the common-mode modulation may cause generation of signal-dependent common mode EMI.

To avoid these effects, the H-bridge 101 may additionally be operated in a fourth state, state D in FIG. 2. In this state both outputs are connected to Vdd. This state, like state C, thus has a differential output of zero, but the common-mode voltage is Vdd, not zero. The amplifier is then operated such that, in those cycles where a zero differential voltage is desired, i.e. the output of the tri-level comparator is logic 0, logic 106 operates to ensure that each of states C and D is chosen on average for half of those cycles. Thus, just considering the zero states, the average common-mode voltage will be Vdd/2. Since the output common mode voltage in states A and B is also Vdd/2 this means that the output common mode voltage is Vdd/2 independent of output signal and no harmonics are generated.

In this arrangement, however, as the average common-mode output mode is substantially constant at Vdd/2, then if there is any ripple on the power supply the common mode output voltage will exhibit half this ripple. As mentioned above, the common-mode rejection ratio of the subtractor may be only 40 dB to 60 dB and thus the common-mode ripple will result in an unwanted signal component only about 46 dB to 66 dB below the supply ripple which will appear across the load. This may be inadequate in some applications which require a power supply rejection ratio in excess of 80 dB.

SUMMARY OF THE INVENTION

Embodiments of the present invention therefore provide methods and apparatus for Class-D type amplification that at least mitigate some of the above mentioned disadvantages.

Thus according to the present invention there is provided a class D amplifier circuit for amplifying an input signal comprising:

- an H-bridge output stage comprising a plurality of switches for switchably connecting a first output to a first voltage or a second voltage and for switchably connecting a second output to the first voltage or the second voltage; and
- a switch controller configured to control the plurality of switches so as to vary between a plurality of states comprising at least a first state in which the first and second outputs are both connected to the first voltage and a second state in which the first and second outputs are both connected to the second voltage;
- wherein the switch controller is configured to vary the proportion of time spent in the first state relative to the second state based on an indication of the amplitude of the input signal.

The switch controller may be configured to reduce disparity between time spent in the first and second states in response to the input signal amplitude increasing and increase disparity between time spent in the first and second states in response to the input signal amplitude decreasing.

The first voltage may be substantially at ground and the second voltage may be a supply voltage.

The switch controller may be configured to increase the time spent in the first state compared to the second state in response to the input signal amplitude decreasing.

The amplifier circuit may also comprise first circuitry for deriving a proportion value based on the indication of the amplitude of input signal and the switch controller my vary the proportion of time spent in the first state relative to the second state in response to the proportion value. The first circuitry may comprise a translation circuit for translating an input signal to a target proportion value. The translation circuitry may comprise at least one of: a look-up table, a combinatorial logic circuit or a comparator.

The translation circuitry may be configured such that the variation in target proportion value with input signal amplitude includes at least one step-wise change and/or such that the target proportion value varies continually with variation in input signal amplitude for at least a range of expected signal amplitudes.

The first circuitry may also comprise an envelope detector for receiving a version of the input signal and determining the amplitude and may be configured to vary the proportion value more rapidly in response to increases in amplitude of the input signal than in response to decreases in amplitude of the input signal. A delay may be applied between a decrease in amplitude of the input signal and any consequent variation in the proportion value.

The amplifier circuit may also comprise second circuitry for generating control signals for selecting the first state or the second state, the second circuitry being responsive to the proportion value.

The amplifier may include a pulse train generation circuit configured to generate, over a set of clock cycles in which the H-bridge output is to be switched to the first state or the second state, a first logic state for a proportion of the set of clock cycles substantially equal to the proportion value and to generate a second logic state for the remainder of the set of clock cycles. The pulse train generation circuit may comprise a noise shaper circuit, such as a delta-sigma modulator circuit.

The second circuitry may be responsive to the logic state produced by the pulse train generation circuit to select the first state or the second state.

The amplifier circuit may comprise a quantizer for sampling the input signal and generating an quantizer output which may include zero and the second circuitry may configured to generate the control signals for selecting the first state or the second state in response to a quantizer output of zero.

The switch controller may be configured such that if the indication of the amplitude of the input signal amplitude decreases below a lower threshold the proportion of time that H-bridge stage is switched into the second state for less than a quarter of the time spent in either of the first or second states. In some embodiments the H-bridge amplifier stage is not switched into the second state if the indication of the amplitude of the input signal amplitude decreases below a lower threshold.

If the input signal increases above an upper threshold the proportion of time spent in the first state may be controlled to be equal to the proportion of time spent in the second state. The lower threshold may be equal to the upper threshold.

The amplifier circuit may further comprise run length limiter circuitry configured so as to monitor the frequency of switching to the first or second states and to cause the switch controller to introduce an occurrence of switching to either the first or second state as required to maintain at least a desired minimum frequency. Run length limiter circuitry may be responsive to the quantizer output and acting to modify some quantizer non-zero output samples to be zero and may be configured to modify pairs of quantizer non-zero output samples of opposite polarities by replacing with pairs of zero outputs. A quantizer non-zero output indicating one polarity followed by a non-zero output indicating the opposite polarity may be replaced with two outputs of zero.

The amplifier circuit may further comprise edge-filter circuitry configured to receive a signal indicating the desired states of the H-bridge stage and to re-order the occurrence of the states if required in order to reduce the number of state transitions.

The amplifier circuit may comprise a feedback path from the outputs of the output stage configured to provide a feedback signal to be compared to the input signal.

The amplifier circuit may be implemented as an integrated circuit and/or a driver circuit and may be arranged to drive at least one of: an audio transducer, a haptic transducer, an ultrasound transducer; or an electromechanical actuator or motor.

The amplifier circuit may be included in an electronic device which may be at least one of: a portable device; a battery powered device; a mobile communications device; a computing device; a gaming device; an audio device; or an ultrasonic device.

The invention also relates to a method of amplifying and thus, in another aspect of the invention, there is provided a method of amplifying an input signal in a Class-D amplifier having an H-bridge stage comprising:

switchably connecting a first output between a first and a second voltage and switchably connecting a second output between the first and the second voltage so as to amplify the input signal; and varying the proportion of time spent in a first state in which the first and second outputs are both connected to the first voltage relative to a second state in which the first and second outputs are both connected to the second voltage based on an indication of the amplitude of the input signal.

The method may include reducing disparity between time spent in the first and second states in response to the input signal amplitude increasing and increasing disparity between time spent in the first and second states in response to the input signal amplitude decreasing. The method may also include increasing the time spent in the first state compared to the second state in response to the input signal amplitude decreasing. The method may include deriving a proportion value based on the indication of the amplitude of the input signal and may involve varying the proportion of time spent in the first state relative to the second state in response to the proportion value.

BRIEF DESCRIPTION OF THE DRAWINGS

The invention will now be described by way of example only, with respect to the following drawings, of which.

DETAILED DESCRIPTION OF THE PREFERRED EMBODIMENTS

Figure 3:
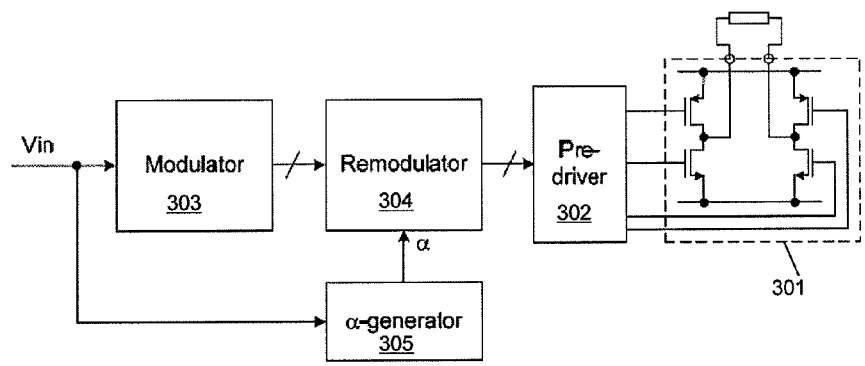
FIG. 3 shows the principles of an amplifier arrangement according to an embodiment of the invention.

FIG. 3 illustrates the principles of a pulse-density-modulated Class-D amplifier according to an embodiment of the invention. It will be understood however that the principles may be applicable to any type of Class-D amplifier, which are sometimes referred to as sigma-delta amplifiers or switched amplifiers.

Figure 1:
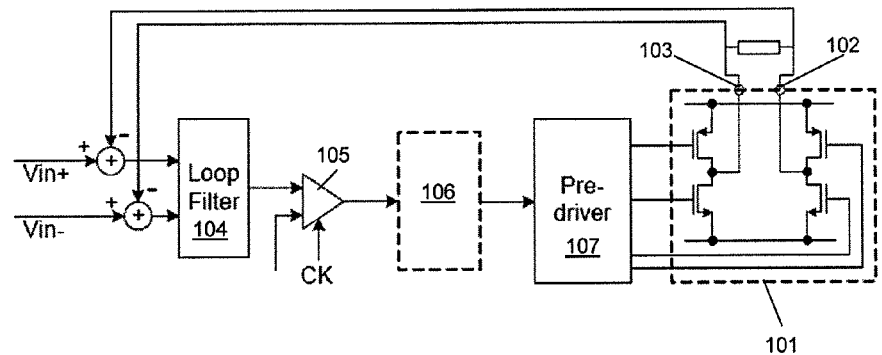
FIG. 1 shows a basic Class-D amplifier.
Figure 2:
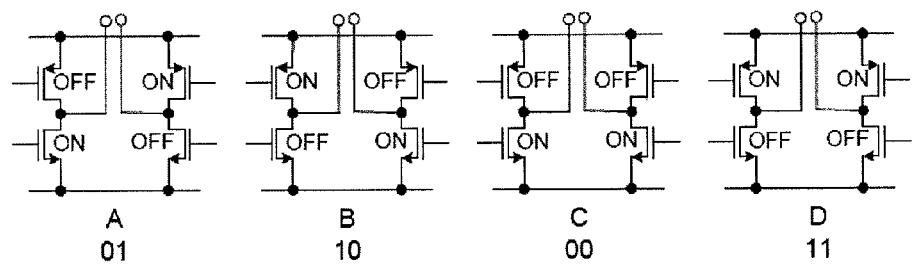
FIG. 2 shows four possible output states of an H-bridge output stage.

The amplifier arrangement shown in FIG. 3 has an H-bridge stage 301 which is driven by pre-driver circuitry 302 to be operable in each of the four states illustrated in FIG. 2. The amplifier comprises modulator circuitry 303 for receiving the input signal Vin and deriving a control signal indicative of which output state the H-bridge should be switched into. The modulator 303 may therefore comprise a three level comparator as described previously, or more generally any three level quantizer. Thus the output of the modulator may be, for example, a logic +1, 0 or −1 depending on the level input signal. It will be noted that FIG. 3 omits the feedback path discussed above with relation to FIG. 1 for clarity. Some other embodiments may operate "open-loop", i.e. have no feedback path from the amplifier outputs to compare to the input signal Vin.

The logic state output from the modulator 303 is received by remodulator 304 which modifies the modulator output such that, when the modulator output is logic state 0, the H-bridge 301 is controlled to be in state D for a fraction α of the relevant time and in state C for a fraction (1−α) of the relevant time. The remodulator 304 is shown as a separate block to modulator 303 in FIG. 3 for the purposes of explanation but it will be appreciated that the functions can be combined into a single functional block if desired.

The fraction α is determined from the input signal Vin. The amplifier thus comprises circuitry for deriving a proportion value, i.e. α, from the input signal Vin and is arranged such that the remodulator 304 (which forms part of the switch control circuitry of the amplifier) varies the proportion of time spent in state C relative to state D in response to the proportion value. The amplifier thus has α-generator 305 which derives the value α which varies in response to changes in the input signal level. Together the modulator 303, remodulator 304, pre-driver 302 and α-generator 305 can be seen as a switch-controller for controlling the switch state of the H-bridge 301.

By varying the proportion of time that the H-bridge output spends in the state D (both outputs at Vdd) compared to state C (both outputs at ground) the average common-mode voltage and hence average ripple on the common-mode voltage can be controlled.

This allows the power supply rejection to be improved for small signal levels (where power supply rejection issues may be of greater importance) but also allows the common mode voltage to be close to Vdd/2 for high signal levels to maximise the available maximum output swing and help prevent clipping.

In most typical embodiments the ground supply will be a relatively clean, i.e. noiseless, supply with substantially no or low power supply ripple and any significant power supply ripple will be on the supply Vdd. In such embodiments reducing the relative proportion of state D (both outputs at Vdd) compared to state C (both outputs at ground) will reduce the power supply ripple on the common mode voltage, as more time is spent with both outputs at the clean ground supply—in other words the common-mode output ripple due to the supply voltage Vdd is reduced. However this will also reduce the average common mode output voltage from Vdd/2. This does mean that with a small value of α, i.e. less than 0.5, the common-mode output voltage will vary in accordance with the input signal as described previously.

It has been appreciated however that there are advantages to varying the fraction α in order to provide a trade off between power supply rejection capability and harmonic distortion (and/or common mode EMI) and also to ensure correct operation at higher input signal amplitudes.

Thus for a low amplitude input signal, power supply rejection may be relatively important. As will be appreciated the power supply ripple will depend on the supplies available and may be independent of the input signal level. Thus for low input signal levels power supply ripple may be a significant concern whereas harmonic distortion due to the common-mode output voltage varying with the input signal may be less of a concern as the variation in common-mode output voltage depends on the input signal amplitude. Thus for a low amplitude input signal the value of α may be set to a relatively low level to improve power supply rejection without resulting in significant distortion.

For high signal levels the effect of distortion could potentially be more significant than power supply rejection issues since any spurious signal due to power supply noise coupling will tend to be masked by the large signal present and thus the value of α may be set at or close to 0.5 to reduce the variation in common-mode output voltage. This also ensures that the maximum possible voltage swing is available at high signal levels.

The α-generator 305 is therefore arranged to determine an appropriate target level of a based on the amplitude of the input signal Vin. It should be noted that the input signal itself may be used or information about the input signal amplitude, for instance from an upstream processor or gain control element could be used instead. The α-generator 305 may therefore be arranged to vary the value of α further away from 0.5 with reducing signal amplitude to increase the disparity between the relative proportions of time spent in state C as compared to state D. The α-generator may be arranged to vary the value of α to be closer to 0.5 with increasing signal amplitude so as to reduce the disparity between the time spent in state C compared to state D.

Figure 4:
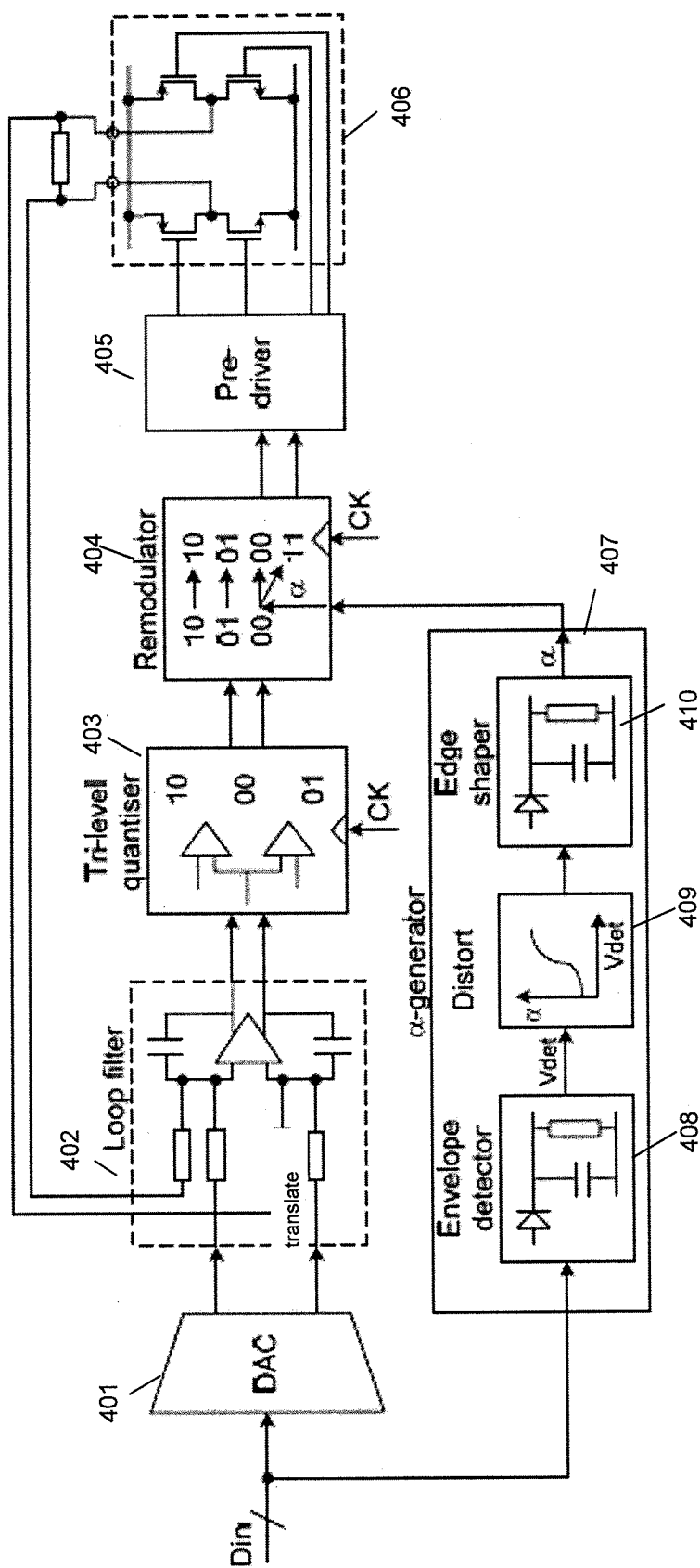
FIG. 4 illustrates an amplifier circuit according to one embodiment of the present invention.

FIG. 4 illustrates an embodiment of an amplifier circuit according to the present invention in more detail. The amplifier of FIG. 4 receives a digital input signal Din which is converted by Digital-to-Analogue converter (DAC) 401 into an analogue version Ain of the input signal, which may be a differential analogue signal as shown. The analogue input signal, Ain, is input to a loop filter 402 which receives feedback signals of the output voltages and generates filtered error signals as described previously in relation to FIG. 1. The error signals pass to a quantizer 403 which in this example is a tri-level quantizer clocked by a clock signal at a relatively high drive frequency to provide a pulse density modulated three level drive signal. In this example the output of the tri-level quantizer 403 may be a two wire drive signal and the output may be represented as signals 10, 00 and 01. The output from tri-level quantizer 403 is input to remodulator 404.

The remodulator 404 is clocked by the clock signal and has four logic output states, 10, 00, 01 and 11. Inputs 10 and 01 are mapped to the output states 10 and 01. However input logic state 00 is mapped to be output logic state 11 for a proportion a of the relevant cycles (i.e. of those cycles where the remodulator receives 00) and is mapped to output state 00 for the rest of the relevant cycles.

The output of remodulator 404 is passed to pre-driver 405 which controls the H bridge stage 406 as described previously.

It will of course be appreciated that the function of the quantizer 403 and remodulator 404 may be combined. Additionally or alternatively the function of the remodulator 404 and pre-driver 405 may be combined and the remodulator 404 may directly produce drive signals for the H-bridge 406. In addition the remodulator 404 could produce a four level output, for example with a 50% ratio of state C and state D and the remodulator 404 could remodulate the two zero states in accordance with the value of α. In some embodiments the modulator 404 may be only a two level quantizer and the remodulator 404 acts to replace the +1 or −1 states with zero level states when appropriate, for instance by determining sequences where the states alternate in quick succession.

The value α is determined by the α-generator 407 and provided to the remodulator 404, for example as a multi-bit digital signal, although an analogue signal indicative of a target value for a could be generated if desired in alternative embodiments.

As shown in FIG. 4 the α-generator 407 may be arranged to receive the input digital signal Din, although it will of course be appreciated that the same principles apply to analogue input signals or input digital signals after conversion to an analogue signal Ain. The α-generator 407 may comprise an envelope detector 408, translation or mapping circuitry 409 and an edge shaper 410.

Figure 5:
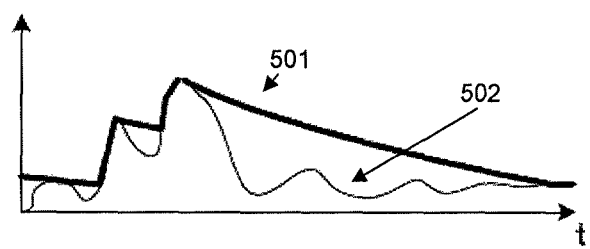
FIG. 5 illustrates an example of the operation of the envelope detector.

The envelope detector 408 detects the amplitude of the input signal Din/Ain. In one embodiment the envelope detector is arranged to quickly follow any peak in the input signal but then decay at a rate slower than the expected frequencies of the input signal, e.g. audio frequencies. This is illustrated in FIG. 5 which illustrates how the output signal 501 from the envelope detector 408 may vary in response to the input signal 502, i.e. Din/Ain. This can be achieved, for example, by using a relatively fast attack time constant but a slower decay time constant. The fast attack time allows the rapid increase of common-mode voltage for a sudden increase in signal, to avoid overload and/or distortion at the amplifier output. The long decay time constant avoids audio frequency modulation of the target amplifier common-mode output voltage with possible consequential artifacts.

The output signal Vdet of the envelope detector 408 passes to the translation circuitry 409 which applies an appropriate transfer characteristic to it to derive an indication of α.

As mentioned previously, for good supply rejection at low signal levels the translation block will generate a low value of α, i.e. <<0.5, at low signal amplitudes. For high signal levels, the value of α will be close to or at 0.5.

Figure 6:
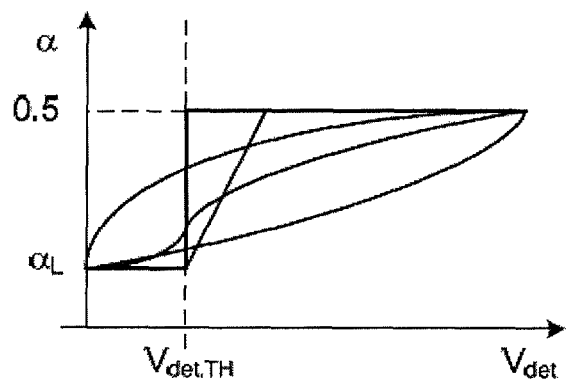
FIG. 6 shows a variety of example transfer characteristics.

The transfer characteristic may be chosen according to the performance and dynamics of a particular system. For example, the value of α may be continually variable between minimum and maximum signal amplitude levels or the value of α may change in stepwise fashion. Above a certain amplitude threshold the value of α may be set at 0.5. Below a certain amplitude threshold the value of α may have a fixed value. In some embodiments the value of α may be reduced to zero at certain signal levels, in other words for low amplitude signals the proportion of state D may be zero, i.e. whenever logic state 00 is indicated by the quantizer 403 the remodulator will output state 00. FIG. 6 illustrates a number of example transfer characteristics between the determined input peak voltage, i.e. signal amplitude, $V_{det}$ and the resulting value of α. It can be seen that in some of these examples a threshold voltage $V_{det,TH}$, or a plurality of threshold voltages, may be used to provide a stepwise or ramp change in the value of α. Alternatively a smoother transfer function might be preferred, i.e. the target proportion value varies continually with variation in input signal amplitude for at least a range of expected signal amplitudes.

Referring back to FIG. 4, the translation circuitry 409 may be implemented using a look-up table, simple combinatorial logic or, in the case a simple step-wise change, a comparator or other type of quantizer.

Figure 7:
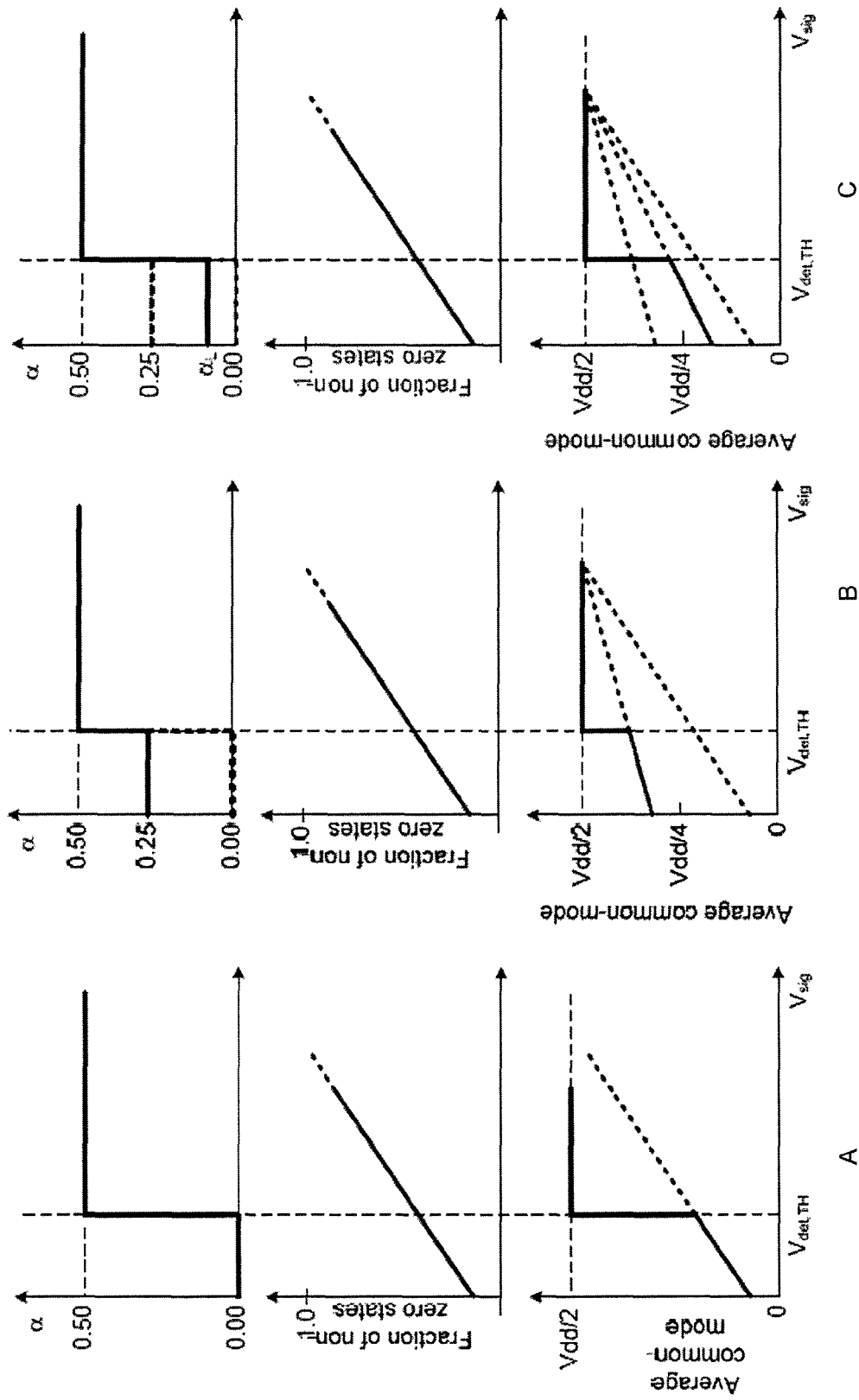
FIGS. 7a-c shows three example transfer characteristics and the effect on common-mode output voltage.

FIG. 7 illustrates three examples of simple cases of stepwise transfer characteristics and illustrates the effect on the average common-mode voltage as a function of determined peak signal level $V_{det}$. In each case the top plot shows the transfer characteristic (solid line), the middle plot shows the fraction of non-zero states, i.e. the fraction of cycles in which the H-bridge is in state A or state B and the lower plot shows the resulting average common-mode voltage. FIG. 7 illustrates that even at minimum signal levels there may be a certain fraction of non-zero states which may be the result of high frequency quantization noise, i.e. occasional high and low pulses inserted by the loop and/or deliberately added as dither to break up any low level tones and accommodate any system offset voltage. In an ideal amplifier arrangement however the plot of fraction of non-zero states would pass through, or at least close to, the origin. The plots in FIG. 7 were derived for a d.c. input signal level for ease of explanation although the same principles apply to time varying input signals.

FIG. 7A illustrates a transfer characteristic in which below a certain threshold, $V_{det,TH}$, the value of α is zero and above the threshold the value of α is 0.5. The lower plot of FIG. 7A shows the effect on the average common mode voltage. Below the threshold $V_{det,TH}$ the proportion of time spent in state D, compared to state C, is zero, i.e. state D is not used. As the common mode voltage in state C is zero and the common mode voltage in both states A and B is Vdd/2 the average common mode voltage increases as the signal level, and hence fraction of non-zero states, increases. If the detected input signal level increases and crosses the threshold however, the value of α changes to 0.5. In this regime the proportion of time the H-bridge spends in state C is the same as the proportion of time that the H-bridge spends in state D. Thus the average common mode voltage is Vdd/2 whatever the actual signal level, as illustrated by the solid line in the lower plot of FIG. 7A (the dashed line represents how the average common mode voltage would change if the value of α was maintained at zero).

At small signal levels, less than the threshold signal level $V_{det,TH}$, the modulation in common-mode voltage will lead to some harmonic distortion as described previously but it can be seen that amplitude of such distortion is limited. For higher signal levels the common mode voltage is constant and so the problem of harmonic distortion is removed.

The amount of variation in average common-mode voltage may be reduced by choosing a higher value for a below the threshold signal level. FIG. 7B shows a transfer characteristic where α is set at 0.5 above the threshold as before but is set equal to 0.25 below the threshold signal level. It can be seen that the overall level of the average common-mode voltage is higher for signal levels below the threshold (than was the case when α was set to 0 below the threshold) but the amount of modulation in the common-mode voltage is reduced. This means that less harmonic distortion is experienced at lower signal levels but that the effects of any power supply ripple will be greater, i.e. the degree of power supply rejection will be less.

The value of α can be adjusted as a trade-off between power supply ratio rejection (PSRR) versus total harmonic distortion (THD). FIG. 7c shows a value of α below the threshold signal level which is an intermediate value between 0.25 and 0.

Whilst for ease of explanation the examples shown in FIG. 7 show a transfer characteristic with a step change in the value of α at the appropriate threshold it may be advantageous to use a transfer characteristic with a smoother transition to avoid possible transients resulting from a sudden change in the value of α.

Referring back to FIG. 4, the value of α determined by the translation circuitry 409 may be used directly by the remodulator 404 but, as shown in some embodiments, an edge shaper 410 may be used to control variations in the value of α.

If the input signal varies in amplitude the detected peak signal level $V_{det}$ will likewise vary, which may result in a change in the value of α. The modulation of the value of α will result in a change in the output common-mode as described previously. As also described previously in relation to the envelope detector it is advantageous to act on any increase in signal level quickly, to avoid any signal clipping issues, but it may be useful to decrease the value of α more gradually, to avoid introducing any spurious signal artifacts. It may also be advantageous to hold an increased value of α at the new level for a short period of time to avoid frequent alteration, i.e. to apply a delay between a decrease in amplitude of the input signal and any consequent variation in the value of α. This is especially the case if the transfer characteristic exhibits a step-wise change or similar discontinuity.

Figure 8:
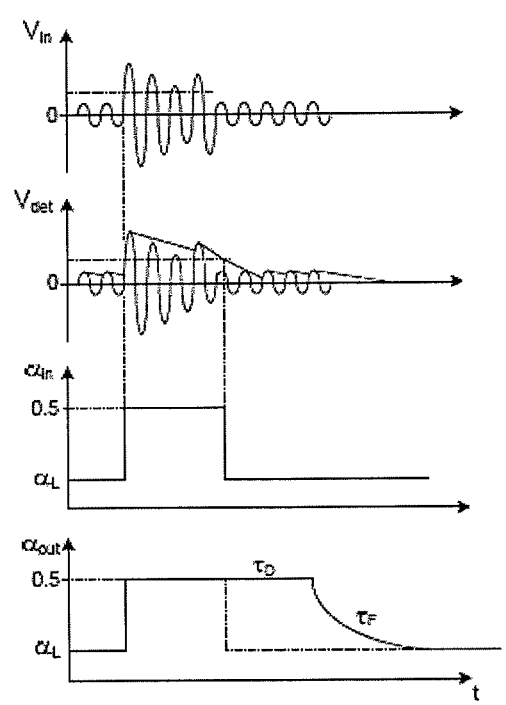
FIG. 8 illustrates the operation of the α-generator with edge shaping.

The edge shaper 410 may therefore apply a delay $\tau_D$ before reducing the value of α. Additionally or alternatively any reduction in α may occur over a fall time $\tau_F$ as illustrated in FIG. 8 in relation to a transfer characteristic such as shown in FIG. 7. The top plot of FIG. 8 illustrates the input signal against the threshold signal level. The next plot illustrates the output Vdet of the envelope detector. The third plot illustrates the value of α output from the translation circuitry 409. The lower plot illustrates the value of α output from the edge shaper 410. In this embodiment the edge shaper 410 applies the delay $\tau_D$ (after the output from the translation circuitry decreases) before starting to reduce the value of α and then applies a gradual reduction over a fall time $\tau_F$.

In this way the value of α and hence the common-mode output is increased rapidly in line with any sudden increase in signal amplitude. Any glitch that arises due to the sudden change in the value of α will likely by masked by the sudden signal that caused it. However decay, which may occur during moments of lower signal amplitude and thus is less likely to be masked, is slow enough so as to avoid any glitches or ensure that they do not affect the output signal, i.e. in an audio application that any signal artifacts are not audible.

It will of course be appreciated that any delay could be incorporated into the translation circuitry 409 and/or the relevant transfer characteristic, i.e. the functionality of the edge shaper 410 could be provided by the envelope detector 408 and/or translation circuitry 409. It will also be appreciated that in some embodiments where an input digital signal Din is used, the peak signal level may be determined elsewhere and provided to the α-generator, in which case the envelope detector 408 functionality may not be required. Indeed in some embodiments the α-generator may not be responsive to the input signal Din itself but instead some other signal indicative of the peak signal level or amplitude. This may for instance be based on a gain control signal such as a volume control in audio applications. Alternatively the value of α may be generated from a signal indicative of loading, for example detection of a particular type of output connection. In some applications, an indication of signal amplitude may be obtainable from upstream digital signal processing functions, for example mp3 decoding or dynamic range compression functions, in which case any intervening processing delay may be used advantageously to allow perhaps less sudden increases in □□without danger of output signal clipping or to allow quicker reductions of α safe in the pre-knowledge that the signal will remain at a low level for some time.

In some applications, if the extent of supply ripple is largely influenced by some other process of a host device the detection of the operation of such process may additionally or alternatively be used to control the value of α. For example, if supply ripple is significantly increased by operation of an r.f. transmitter in the host device, such as a mobile phone for example, the detection that the transmitter has been enabled or disabled (for example by a user selecting a desired wireless setting) may be used in the determination of an appropriate value of α.

It should be noted that in a typical arrangement where the H-bridge is connected between a relatively noiseless ground supply and a supply voltage Vdd, which may have supply ripple, the value of α will not usually be greater than 0.5. A value of α which is greater than 0.5 would mean that state D, both outputs connected to the relatively noisy Vdd supply would occur more frequently than state C, both outputs connected to the relatively noiseless ground. This would worsen the power supply rejection characteristics whilst also resulting in a variation in common-mode output voltage with the input signal, thus leading to harmonic distortion and possibly premature clipping of the signal at the output.

In some embodiments however it may be the case that the ground supply may be relatively more noisy than the supply voltage Vdd. In such a case the power supply rejection would be improved by increasing the proportion of state D (both outputs at Vdd) compared to state C (both outputs at ground). In such an embodiment the α-generator may vary the value of α between 0.5 (for good distortion performance but worst power rejection) and 1.0 (for good ground noise or ripple rejection but worst distortion).

It is also conceivable that in some embodiments issues of power supply rejection may not be a significant issue, for example due to the availability of very stable clean supply voltages, but power consumption may be a critical issue. Thus, it may be desired to reduce the number of state transitions where possible by using a single zero state only— however at high signal levels the use of a single zero state, with the resultant modulation in common-mode output may lead to higher than acceptable distortion or excessive common mode EMI. Thus in such an arrangement it may be desired to use a value of α at or close to 0.5 at high signal levels to reduce distortion or common mode EMI but to vary a to reduce the number of state transitions at low signal levels. In such an embodiment, even if power supply rejection is not a concern, then in theory either a value of α at or near to 0 or equally at or near to 1 could advantageously be used at low signal levels.

This may for instance apply in an embodiment where the H-bridge output is connected between a positive supply voltage +Vdd and a negative supply voltage −Vdd. In such an embodiment both power supplies may be equally as noisy and thus power supply rejection may not be improved by using one zero state (both outputs connected to +Vdd) as compared to the other zero state (both outputs connected to −Vdd)— however there may be an advantage in using one state in preference to the other at some signal levels to avoid unnecessary state transitions but to use both states approximately equally at higher signal levels to reduce any variation in common-mode output voltage.

It will of course be appreciated that if a Class-D amplifier is arranged with an output stage switchably connectable between bipolar supply voltages and one supply voltage exhibits significantly less noise than the other supply the principles of balancing power supply rejection with harmonic distortion would apply, with the output common mode biased towards whichever is the cleaner supply. For instance the positive supply might be subject to noise induced from the variable loading of other circuitry (e.g. 217 Hz-related GSM supply pulses) while the negative supply was generated and post-regulated to provide a cleaner supply dedicated for audio. Or the positive supply might be a clean supply suitable for use with audio processing circuitry, but for reasons of economy, the negative supply is generated in some simple but noisy fashion, for example by means of an inverting charge pump.

Figure 9:
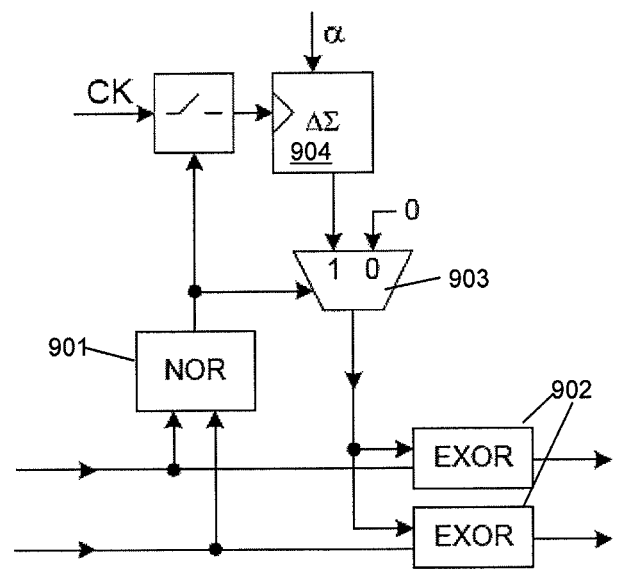
FIG. 9 shows one embodiment of a remodulator circuit.

Referring back to FIG. 4 the α-generator 407 supplies the value of α to the remodulator 404, conveniently as a parallel digital word. The remodulator 404 comprises circuitry, responsive to the value of α, for generating control signals for selecting state C or state D. FIG. 9 shows one embodiment of remodulator 404. The two-wire input from the tri-level quantizer 403 is received and input to both NOR gate 901 and EXOR gates 902. Unless the input is 00 the output from the NOR gate 901 will be logic 0 and thus the multiplexer will input logic 0 into each of the EXOR gates 902. Thus the output of the EXOR gates will thus follow the logic state of the signal at the other input and the output of the remodulator 404 will follow the input.

When the input logic state is 00 the NOR gate 901 will output logic 1 thus enabling the clock signal to noise shaper or word-length reduction block 904, in this case a delta-sigma modulator which is responsive to the value of α. While the input is 00 the delta-sigma modulator is allowed to clock. So for those time samples where the input is 00 and the H-bridge output is to be switched to state C or state D, i.e. the relevant cycles, the delta-sigma output is a delta-sigma-type pulse train with an average duty cycle equal to α. The output will be 1 for a fraction α of the relevant cycles and 0 for the remaining fraction (1−α) of the relevant cycles When the input is 00 the multiplexer 903 passes the output of the delta-sigma modulator into the EXOR gates 902. This will result in the output being changed from 00 to 11 for a fraction α of the relevant cycles whilst being left unchanged as 00 in the fraction (1−α) of the relevant cycles.

Figure 10:
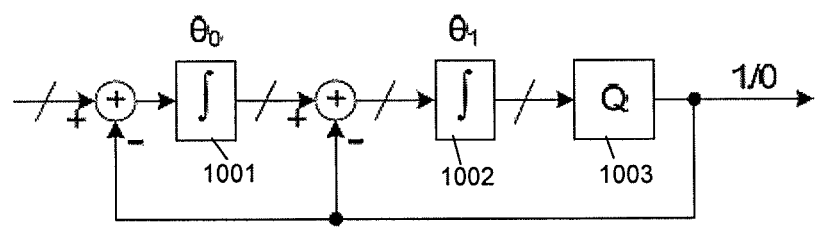
FIG. 10 illustrates one example of a delta-sigma modulator suitable for use in the remodulator circuit shown in FIG. 9.

FIG. 10 shows a suitable delta-sigma modulator 904 as will be understood by one skilled in the art. A multi bit input passes through a plurality of integrators 1001, 1002 with gains $\theta_0$, $\theta_1$, before being input to a single bit quantizer 1003.

Referring back to the remodulator 404 illustrated in FIG. 9, the delta-sigma modulator 904 could instead be replaced by an N-bit counter arranged to increment every time the remodulator input is 00 (resetting when the maximum count is reached) and a comparator arranged to compare the output of the N-bit counter to $\alpha.2^N$. In this way the comparator would output a logic 1 for a fraction α of each set of $2^N$ relevant cycles (relevant cycles being those where the input is 00) and output logic 0 for the fraction (1−α) of each set of $2^N$ relevant cycles, i.e. the remaining cycles. In these cycles the output of the comparator could be selected by multiplexer 903 and input into the EXOR gates 902.

The arrangement of a remodulator 404 employing a delta-sigma modulator 904 or similar noise shaping circuit is preferred because a delta-sigma modulator 904 generates a pulse train that has little quantisation noise at audio frequencies, so will not tend to produce audible artefacts. In contrast employing a counter may, in the presence of quiet signals, tend to give tones at a frequency equal to the clock frequency divided by $2^N$, which may be audible or could mix down with the input signal to generate audible tones. The skilled person will however be aware of a number of ways the remodulator 404 may be implemented.

Note that while the output of the noise shaper or delta-sigma modulator 904 may be well noise shaped in respect to the time series of samples that are "relevant samples", the noise spectrum as perceived at the remodulator output will be degraded as these samples appear in actual time points that are altered in dependence on the position of the zeros in the Class D modulator output. This spectral leakage of noise may be mitigated by empirical optimisation of the noise transfer functions and the shape of the resulting noise spectrum during the design of the delta-sigma modulator 904, but there will inevitably be some degradation of common mode audio band noise, and hence a smaller but possibly still significant degradation of noise apparent across the load due to the aforementioned issue of feedback resistor mismatch or other common-mode rejection issues. This may be more severe for low values of □ and require further trade off of supply rejection versus this remodulator quantisation noise leakage as well as distortion.

Figure 11:
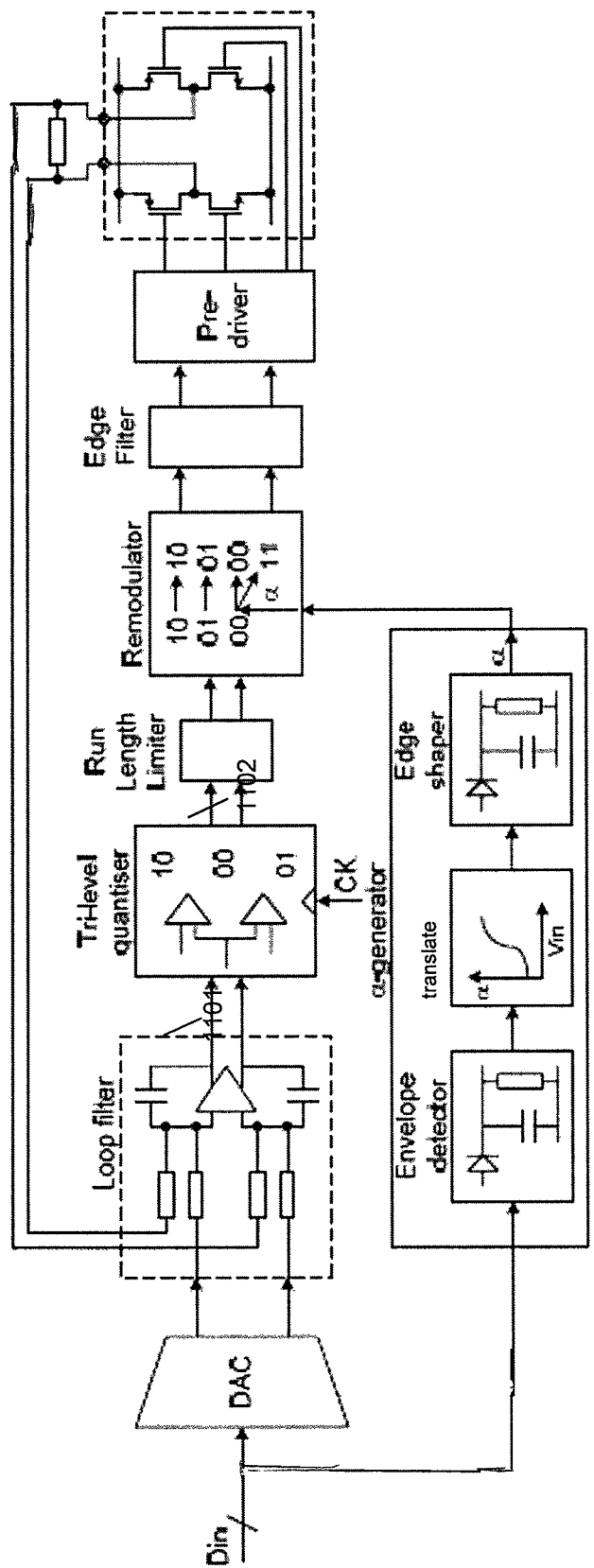
FIG. 11 shows an amplifier circuit according to another embodiment.

FIG. 11 shows a further embodiment of the present invention. Elements which are the same as shown in FIG. 4 are not separately described. In this embodiment however a run length limiter 1101 may be included, for example between the quantizer 403 and remodulator 404. Additionally or alternatively an edge filter 1102 may be included, for example between the remodulator 404 and the pre-driver 405.

The run length limiter 1101 may use known techniques to periodically replace adjacent or near-adjacent pairs of 10 and 01 with a 00 states if a 00 state has not occurred for some time. This allows more states in which the remodulator 404 can act to control the common mode voltage away from Vdd/2, albeit may be slightly increasing the quantisation noise of the system. The increased density of 00 states allows a to be controlled to lower values, thus in turn allowing a greater improvement in PSRR. In essence the run length limiter 1101 monitors the frequency of switching to a zero state and introduces an occurrence of a zero state as required to maintain a desired frequency, although some implementations may not explicitly monitor the frequency of zero states or the interval between them, but rely on the statistics of the received logic states in conjunction with a suitable algorithm or method to generate a statistically adequately improved proportion of zero states.

The edge filter 1102 monitors the signals from the remodulator 404 and time-shifts near-adjacent samples with identical output states to be adjacent, rather than interrupted by intervening non-identical states to reduce the number of state transitions. This may increase the output quantization noise slightly, but will save the power that would be otherwise expended in switching the output switch devices. In other words it receives a signal indicating the desired states of the H-bridge stage 406 and re-orders the occurrence of the states if required to reduce the number of state transitions whilst maintaining the average proportions of each state.

In general therefore embodiments of the present invention provide Class-D amplifiers that are operable in at least a first state where both of the outputs are connected to a first voltage, e.g. ground, and a second state where both of the outputs are connected to a second voltage, e.g. Vdd, and provides for varying the fraction of time spent in the first state as compared to the second state. The amount of time spent in the first state compared to the second state may be increased at low signal power levels to improve power supply rejection and/or reduce power loss by reducing the number of state transitions. The proportion of time spent in the first state compared to the second state may be adjusted to reduce any disparity at higher signal levels, for instance to reduce possible THD.

The embodiments described above have been described in the context of a digital input signal Din although the same principles apply to analogue input signals Ain. The embodiments have also been described in relation to closed loop arrangements with feedback from the output to the input. The general principles of the invention are also applicable to open-loop arrangements or to amplifier arrangements with feedforward loops. Although it is appreciated that some of the artifacts due to feedback may not occur, or be as pronounced in an open loop arrangement, the idea of varying the fraction of the various zero states may still provide benefits in terms of power supply rejection, reduced power consumption or EMI emissions.

The amplifier circuit may advantageously be used to amplify audio input signals for instance as part of an audio driving circuit or audio signal processing circuit. However embodiments of the invention may be implemented to amplify a range of different input signals for a variety of applications. In particular, the amplifier may be used in a driver circuit to drive an output for a haptic interface, an ultrasound transducer or a electromechanical actuator or motor.

The amplifier circuit may conveniently be implemented as an integrated circuit and may form part of a host electronic device, especially a portable device and/or a battery powered device. The amplifier may be used in an audio device such as a personal music or video player. The amplifier may be implemented in a mobile communications device such as mobile telephone or a computing device, such as a laptop or tablet computer or PDA. The amplifier may be used in a gaming device. The amplifier may be used in device having an ultrasonic transducer.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfill the functions of several units recited in the claims. The word "amplify" can also mean "attenuate", i.e. decrease, as well as increase. Any reference numerals or labels in the claims shall not be construed so as to limit their scope.

What is claimed is:

1. A class D amplifier circuit for amplifying an input signal comprising:
   an H-bridge output stage comprising a plurality of switches for switchably connecting a first output to a first voltage or a second voltage and for switchably connecting a second output to said first voltage or said second voltage; and
   a switch controller configured to control said plurality of switches so as to vary between a plurality of states comprising at least a first state in which the first and second outputs are both connected to the first voltage and a second state in which said first and second outputs are both connected to said second voltage;
   wherein said switch controller is configured to vary the proportion of time spent in the first state relative to the second state based on an indication of the amplitude of the input signal;
   wherein the circuit further comprises first circuitry for deriving a proportion value based on said indication of the amplitude of input signal; and
   wherein said first circuitry comprises a translation circuit for translating an input signal to a target proportion value.

2. A class D amplifier circuit as claimed in claim 1 wherein said switch controller is configured to reduce disparity between time spent in the first and second states in response to the input signal amplitude increasing and increase disparity between time spent in the first and second states in response to the input signal amplitude decreasing.

3. A class D amplifier circuit as claimed in claim 1 wherein the first voltage is substantially at ground and the second voltage is a supply voltage.

4. A class D amplifier circuit as claimed in claim 1 wherein the switch controller is configured to increase the time spent in the first state compared to the second state in response to the input signal amplitude decreasing.

5. A class D amplifier circuit as claimed in claim 1 wherein the switch controller varies the proportion of time spent in the first state relative to the second state in response to said proportion value.

6. A class D amplifier circuit as claimed in claim 1 wherein said translation circuitry comprises at least one of: a look-up table, a combinatorial logic circuit or a comparator.

7. A class D amplifier circuit as claimed in claim 1 wherein said translation circuitry is configured such that the variation in target proportion value with input signal amplitude includes at least one step-wise change.

8. A class D amplifier circuit as claimed in claim 1 wherein said translation circuitry is configured such that the target proportion value varies continually with variation in input signal amplitude for at least a range of expected signal amplitudes.

9. A class D amplifier circuit as claimed in claim 1 wherein said first circuitry comprises an envelope detector for receiving a version of the input signal and determining the amplitude.

10. A class D amplifier circuit as claimed in claim 1 wherein said first circuitry is configured to vary the proportion value more rapidly in response to increases in amplitude of the input signal than in response to decreases in amplitude of the input signal.

11. A class D amplifier circuit as claimed in claim 10 wherein said first circuitry is configured to apply a delay between a decrease in amplitude of the input signal and any consequent variation in the proportion value.

12. A class D amplifier circuit as claimed in claim 1 comprising second circuitry for generating control signals for selecting said first state or said second state, wherein said second circuitry is responsive to said proportion value.

13. A class D amplifier circuit as claimed in claim 12 comprising a pulse train generation circuit configured to generate, over a set of clock cycles in which the H-bridge output is to be switched to the first state or the second state, a first logic state for a proportion of said set of clock cycles substantially equal to said proportion value and to generate a second logic state for the remainder of said set of clock cycles.

14. A class D amplifier circuit as claimed in claim 13 wherein the pulse train generation circuit comprises a noise shaper circuit.

15. A class D amplifier circuit as claimed in claim 14 wherein the noise shaper circuit comprises a delta-sigma modulator circuit.

16. A class D amplifier circuit as claimed in claim 13 wherein the second circuitry is responsive to the logic state produced by said pulse train generation circuit to select said first state or said second state.

17. A class D amplifier circuit as claimed in claim 12 comprising a quantizer for sampling the input signal and generating an quantizer output which may include zero and wherein said second circuitry is configured to generate said control signals for selecting said first state or said second state in response to a quantizer output of zero.

18. A class D amplifier circuit as claimed in claim 1 wherein the switch controller is configured such that if the indication of the amplitude of the input signal amplitude decreases below a lower threshold the proportion of time that H-bridge stage is switched into the second state for less than a quarter of the time spent in either of the first or second states.

19. A class D amplifier circuit as claimed in claim 1 wherein the switch controller is configured such that if the indication of the amplitude of the input signal amplitude decreases below a lower threshold the H-bridge amplifier stage is not switched into the second state.

20. A class D amplifier circuit as claimed in claim 1 wherein the switch control circuitry is configured such that if the input signal increases above an upper threshold the proportion of time spent in the first state is controlled to be equal to the proportion of time spent in the second state.

21. A class D amplifier circuit as claimed in claim 1 wherein the switch controller is configured such that if the indication of the amplitude of the input signal amplitude decreases below a lower threshold the proportion of time that H-bridge stage is switched into the second state for less than a quarter of the time spent in either of the first or second states, wherein the switch control circuitry is configured such that if the input signal increases above an upper threshold the proportion of time spent in the first state is controlled to be equal to the proportion of time spent in the second state, and wherein said lower threshold is equal to said upper threshold.

22. A class D amplifier circuit as claimed in claim 1 further comprising run length limiter circuitry configured so as to monitor the frequency of switching to the first or second states and to cause the switch controller to introduce an occurrence of switching to either the first or second state as required to maintain at least a desired minimum frequency.

23. A class D amplifier circuit as claimed in claim 17, further comprising run length limiter circuitry responsive to the quantizer output and acting to modify some quantizer non-zero output samples to be zero.

24. A class D amplifier circuit as claimed in claim 23 wherein the run length limiter circuitry is configured to modify pairs of quantizer non-zero output samples of opposite polarities by replacing with pairs of zero outputs.

25. A class D amplifier circuit as claimed in claim 23 wherein the run length limiter circuitry is configured to replace a quantizer non-zero output indicating one polarity followed by a non-zero output indicating the opposite polarity with two outputs of zero.

26. A class D amplifier circuit as claimed in claim 23 wherein the run length limiter circuitry is responsive to the quantizer output and acts to modify a quantizer non-zero output to be zero as required to maintain at least a desired minimum frequency of zero outputs.

27. A class D amplifier circuit as claimed in claim 1 comprises edge-filter circuitry configured to receive a signal indicating the desired states of the H-bridge stage and to re-order the occurrence of the states if required in order to reduce the number of state transitions.

28. A class D amplifier circuit as claimed in claim 1 comprising a feedback path from the outputs of the output stage configured to provide a feedback signal to be compared to the input signal.

29. An integrated circuit comprising a class D amplifier circuit as claimed in claim 1.

30. A driver circuit comprising a class D amplifier circuit as claimed in claim 1.

31. A driver circuit as claimed in claim 30 wherein said driver circuit is arranged to drive at least one of: an audio transducer, a haptic transducer, an ultrasound transducer; or an electromechanical actuator or motor.

32. An electronic device comprising a circuit as claimed in claim 1.

33. An electronic device as claimed in claim 32 wherein the device is at least one of: a portable device; a battery powered device; a mobile communications device; a computing device; a gaming device; an audio device; or an ultrasonic device.

34. A method of amplifying an input signal in a Class-D amplifier having an H-bridge stage comprising:

switchably connecting a first output between a first and a second voltage and switchably connecting a second output between the first and the second voltage so as to amplify the input signal; and varying the proportion of time spent in a first state in which the first and second outputs are both connected to the first voltage relative to a second state in which said first and second outputs are both connected to said second voltage based on an indication of the amplitude of the input signal wherein the method comprises deriving a proportion value based on said indication of the amplitude of the input signal by using a translation circuit to translate an input signal to a target proportion value.

35. A method as claimed in claim 34 comprising reducing disparity between time spent in the first and second states in response to the input signal amplitude increasing and increasing disparity between time spent in the first and second states in response to the input signal amplitude decreasing.

36. A method as claimed in claim 34 comprising increasing the time spent in the first state compared to the second state in response to the input signal amplitude decreasing.

37. A method as claimed in claim 34 comprising varying the proportion of time spent in the first state relative to the second state in response to said proportion value.

38. A class D amplifier circuit for amplifying an input signal comprising:

an H-bridge output stage comprising first and second outputs;

a switch controller configured to control said H-bridge output stage so as to vary between a plurality of states comprising at least a first state in which the first and second outputs are both connected to a first voltage and a second state in which said first and second outputs are both connected to a second voltage;

wherein said switch controller comprises translation circuit for translating an input signal to a target proportion value based on an indication of the amplitude of the input signal so as to vary the proportion of time spent in the first state relative to the second state.

* * * * *